United States Patent [19]

Fisher et al.

[11] 4,205,241

[45] May 27, 1980

[54] QUANTIZED MODULATION SYSTEMS

[76] Inventors: Charles B. Fisher, 2850 Hill Park Rd., Montreal, Quebec, Canada, H3H 1T1; Sidney T. Fisher, 53 Morrison, Montreal, Quebec, Canada, H3R 1K3

[21] Appl. No.: 20,175

[22] Filed: Mar. 13, 1979

[51] Int. Cl.² .................. H03C 1/52; H03C 3/00; H03F 3/38; H03K 13/175
[52] U.S. Cl. ................................. 307/361; 328/14; 328/150; 330/10; 332/23 R; 332/44; 332/48; 370/7
[58] Field of Search .................. 307/360, 361; 328/14, 328/150; 330/10; 340/347 AD; 179/15 AV; 332/16 R, 16 T, 31 R, 31 T, 44, 23 R, 48; 325/47, 49, 138, 145, 163, 30

[56] References Cited

U.S. PATENT DOCUMENTS

| 3,365,623 | 1/1968 | Stacey | 307/360 X |
| 3,430,151 | 2/1969 | Badessa | 329/50 |
| 3,585,631 | 6/1971 | McCown | 307/360 X |
| 4,153,882 | 5/1979 | Fisher et al. | 330/10 |

OTHER PUBLICATIONS

H. S. Black, "Modulation Theory", New York, 1953, pp. 37, 41, 56, 57.
S. Prigozy, "Zero-Crossing Detector Provides Fast Sync Pulses", Electronics, Apr. 19, 1965, p. 91.
"Transmission Systems for Communications", Bell Telephone Laboratories, 1971, pp. 102, 120-122, 127, 128, 571-583.

Primary Examiner—Siegfried H. Grimm

[57] ABSTRACT

A system for modulation of the amplitude of a d-c voltage, the amplitude of an a-c carrier, or the frequency of an a-c carrier by signal, in which the signal amplitude is continuously compared against a predetermined series of equally-spaced d-c voltages, and coincidence-sensing and switching means associated with each d-c voltage connects a corresponding d-c voltage to the output circuit in the case of an instantaneous compressor, an instantaneous expandor or a signal amplifier, connects a carrier of corresponding amplitude to the output circuit in the case of an amplitude modulator, and connects a carrier of corresponding frequency to the output circuit in the case of an angle modulator.

5 Claims, 9 Drawing Figures

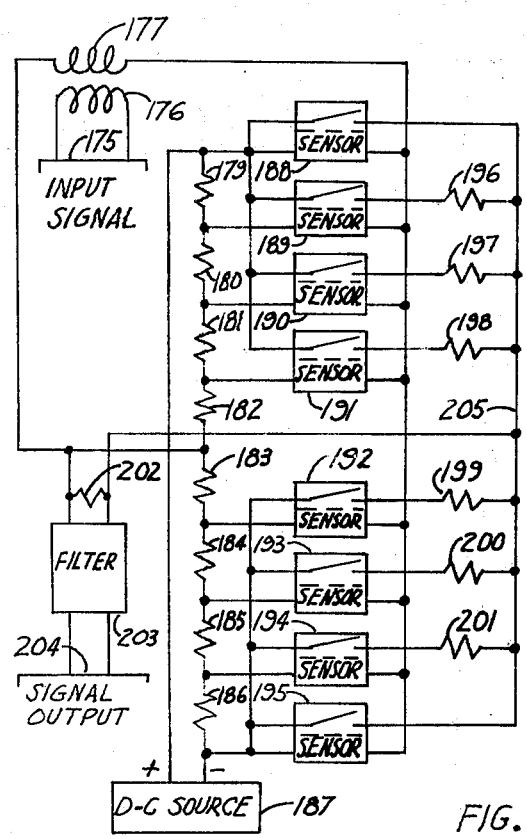
FIG. 5
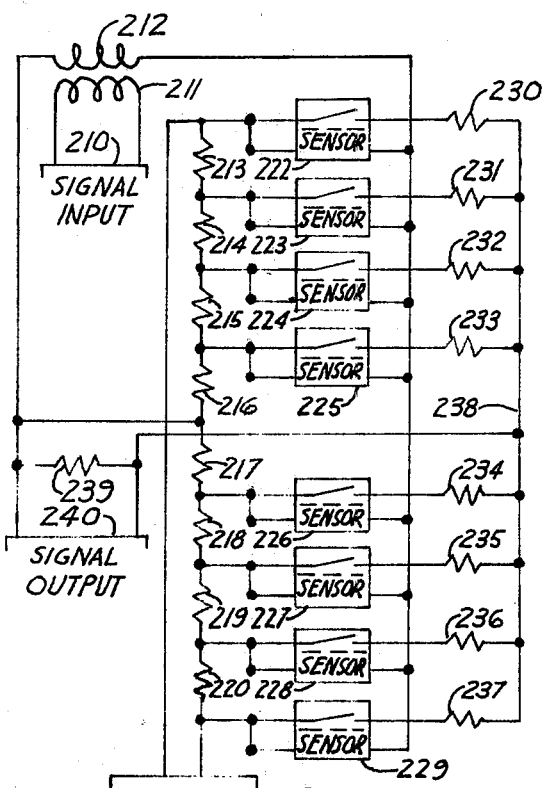
FIG. 6
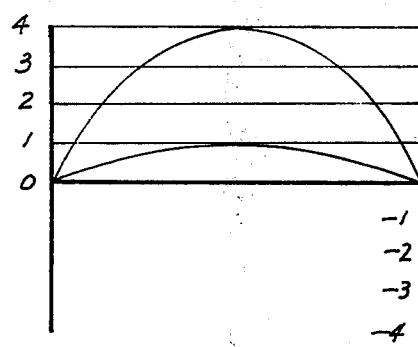
FIG. 7
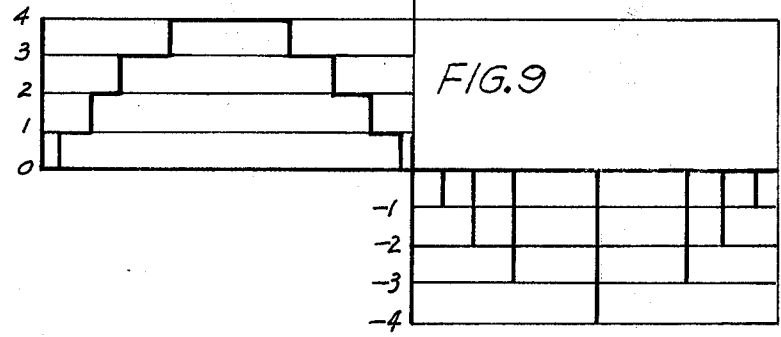
FIG. 9
FIG. 8 a# QUANTIZED MODULATION SYSTEMS

BACKGROUND OF THE INVENTION

Compressors, expandors, signal amplifiers and amplitude and angle modulators of the prior art depend generally on approximation methods in which the amplitude of a signal modulates a d-c voltage or a carrier by means of non-linear circuit elements, with any resulting error in the modulated wave being reduced by negative feedback or other means. We do not know of any prior patent art, publications or apparatus which use invariable quantizing elements to produce modulated d-c or a-c waves which accurately represent the signals, or to produce compressed or expanded signals which follow a precise law.

BRIEF DESCRIPTION AND OBJECTS OF THE INVENTION

This invention relates to compressors, expandors, amplifiers, and modulators for amplitude and angle modulation, in which the signal amplitude is instantaneously quantized by continuous comparison against a set of uniformly-spaced d-c voltages. The smallest of these voltages, measured from the midpoint of the maximum peak-to-peak value of the signal, must be equal to or less than the smallest peak value of signal to be quantized, and the spacing of the voltages must be equal to or less than the smallest step in signal amplitude required to be reproduced. Under these conditions the rate of taking samples is at least two samples per half-period of the highest signal frequency present with a peak amplitude as great as the spacing of the d-c voltages and the smallest of these voltages. This may be designated an aperiodic quantization system.

Thus a finite range of possible signal amplitudes, large enough to accommodate the strongest signal in a given application, is divided into a number of equal quantizing intervals. Each instantaneous amplitude of the signal is then compared with this ladder-like array. Amplitude quantization is accomplished by replacing all amplitudes falling in any portion of a quantizing interval by a single value which uniquely characterizes that interval.

The generalized sampling principle is given by H. S. Black in "Modulation Theory", New York 1953, at page 41. This principle states that if a signal is divided into a number of equal time intervals, each less than half the period of the highest significant frequency component of the signal, and if at least one instantaneous sample is taken from each interval, then knowledge of the magnitude and time of each sample contains the information of the signal.

Quantization noise is generally lower in an aperiodic system than in quantization systems which quantize samples taken at regular time intervals, which may be designated as periodic systems, because the quantized sample in an aperiodic system with short samples has no error except when the signal reverses direction between two quantizing levels and continues in the reversed direction until a quantizing level is reached.

As an amplitude modulator the aperiodic system may be used to produce double-sideband transmitted-carrier, and double-sideband suppressed-carrier waves. Such waves may have greater positive than negative modulation. As an angle modulator the system may be used to produce double-sideband angle-modulated waves.

At the instant when the amplitude of the signal falls within a definite range enclosing the value of each one of a set of predetermined d-c voltages a coincidence-sensing means associated with that particular value of d-c voltage activates associated switching means, which connects a d-c voltage of the corresponding value in the case of a compressor, expandor or signal amplifier, connects a carrier of the corresponding amplitude and a fixed frequency to the output in the case of an amplitude modulator, and connects a carrier of the corresponding frequency and a constant amplitude to the output in the case of an angle modulator.

LIST OF DRAWINGS

This invention is more readily understood by reference to the following drawings:

FIG. 5 shows a simplified block schematic diagram of a quantizing modulator which is a second embodiment of the invention as disclosed in FIG. 1.

FIG. 6 shows a simplified block schematic diagram of a quantizing modulator which is a third embodiment of the invention as disclosed in FIG. 1.

FIGS. 7, 8 and 9 show the waveform occurring in FIGS. 1, 5 and 6.

DETAILED DESCRIPTION OF THE INVENTION

Figure 1:
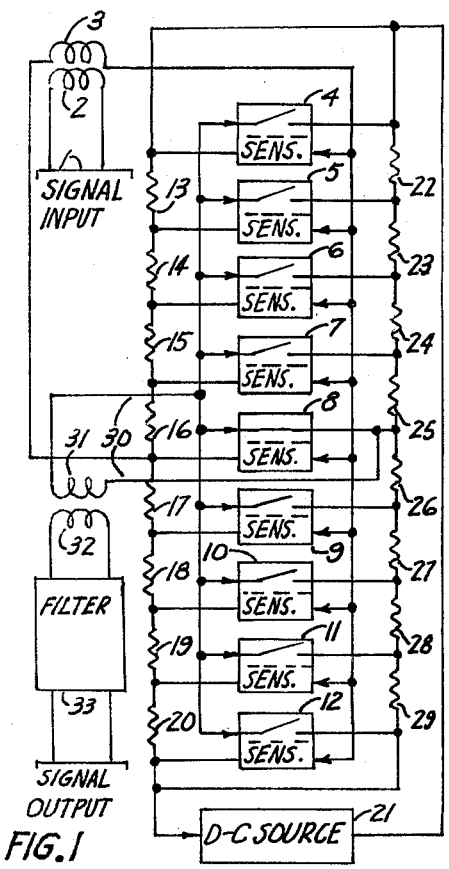
FIG. 1 shows a simplified schematic diagram of a quantizing modulator according to the invention which functions as an instantaneous compressor or expandor, for a wide range of compression characteristics.

FIG. 1 shows a simplified schematic diagram of a quantized modulation system according to the invention, in which a signal is expanded or compressed in a predetermined and accurate manner by quantized modulation of a d-c voltage, not relying on non-linear or variable values of any circuit element.

A signal input 1 is passed by an isolating transformer with primary winding 2 and secondary winding 3. For simplicity FIGS. 1, 2, 3, 4, 5 and 6 show quantized modulation systems which are limited to 9 values, 4 values on each side of zero. In a practical system for speech, however, 100 or more on each side of zero are commonly used. In FIG. 1 an input potentiometer consists of equal resistors 13 to 20 inclusive in series across a constant-voltage d-c source 21. The midpoint of the input potentiometer, which is a convenient but not necesaary choice, that is the junction of resistors 16 and 17, is connected to a first terminal of input winding 3, the second terminal of winding 3 being connected to a first sensing terminal of each of coincidence-sensing switching means 4 to 12 inclusive, hereinafter referred to as sensors. Each of the second sensing terminals of each sensor 4 to 12 inclusive is connected to one terminal on the input potentiometer, so that as the signal input from winding 3 varies from the peak value of one polarity ot the peak value of the other polarity sensors 4 to 12 inclusive operate in succession.

The first switching terminal of each sensor is connected to a first one of output leads 30 which connects to a first terminal of signal output transformer winding 31, with secondary winding 32.

The second switching terminals of sensors 4 to 12 inclusive connect respectively to the junction of the first terminal of d-c source 21 and resistor 22, the junction of resistors 22 and 23, the junction of resistors 23 and 24, the junction of resistors 24 and 25, the junction of resistors 25 and 26, the junction of resistors 26 and 27, the junction of resistors 27 and 28, the junction of resistors 28 and 29, and the junction of resistor 29 and the second terminal of d-c source 21. Resistors 22, 23, 24 and 25 are equal in values to resistors 29, 28, 27 and 26 respectively. The junction of resistors 25 and 26 is connected by one of leads 30 to the second terminal of signal output transformer winding 31.

Resistors 22 to 29 inclusive in series form a potentiometer with the same number of resistors as the potentiometer with resistors 13 to 20 inclusive in series. It is evident that if resistors 22 to 29 inclusive are each equal to, or are a fixed multiple of, resistors 13 to 20 inclusive, respectively, then as a sine-wave signal of the maximum peak-to-peak voltage of winding 3 is applied to resistors 13 to 20 inclusive in series, sensors 4 to 12 inclusive each open and close successively, and the voltage across resistors 22 to 29 inclusive, as delivered to winding 31, follows the voltage across winding 3. The system of FIG. 1 up to filter 33 then functions as an instantaneous quantizer, without gain, compression or expansion. Filter 33 passes only the signal band and smooths the voltage steps to a close approximation to the signal waveform.

If the relations above are continued, but resistors 22 to 29 inclusive in series dissipate more d-c power than resistors 13 to 20 inclusive, either because they have a power source of a higher voltage, or their values are lower, or both, then the system of FIG. 1 functions as a signal amplifier. For example, if the two sets of resistors are equal, but resistors 22 to 29 inclusive in series have an applied voltage 10 times as great as the voltage applied to resistors 13 to 20 inclusive in series, the amplifier has a potential gain of 20 dB. The sensors are each assumed to have very high impedance between the sensing terinals.

The system of FIG. 1 may also function as a compressor or an expandor, depending on the values selected for resistors 22 to 29 inclusive relative to resistors 13 to 20 inclusive. For example, with a signal input range from a minimum peak-to-peak value equal to the d-c voltage across resistors 16 and 17 in series, and a maximum peak-to-peak value equal to the d-c source, a compressor with a compression ratio of 2, and an expandor with expansion ratio of 2 are obtained with values as follows:

Resistors 13 to 20 inclusive each 100 ohms.
D-c source voltage 8 volts.
Range of input voltage for sensor operation ±0.5 volt.
Peak-to-peak signal voltage 8 volts.
Impedance presented by winding 30 to pulses very high.

The following table shows values of resistors 22 to 29 inclusive and signal levels for an amplifier, a compressor and an expandor.

| AMPLIFIER-NO SIGNAL | COMPRESSED SIGNAL | | |
|---|---|---|---|

| SIGNAL INPUT | | COMPRESSION | | OUTPUT | | |
|---|---|---|---|---|---|---|
| Res. Nos. | Val. ea. ohms | Rel. level at outer end,dB | Res. Nos. | Val. ea. ohms | Rel. level at outer end,dB | Res. Nos. | Val. ea. ohms | Rel. level at outer end,dB |
| 16 & 17 | 100 | −12.0 | 25 & 26 | 50 | −12.0 | 25 & 26 | 200 | −6.0 |
| 15 & 18 | 100 | −6.0 | 24 & 27 | 50 | −6.0 | 24 & 27 | 83 | −3.0 |
| 14 & 19 | 100 | −2.5 | 23 & 28 | 50 | −2.5 | 23 & 28 | 63 | −1.25 |
| 13 & 20 | 100 | 0.0 | 22 & 29 | 50 | 0.0 | 22 & 29 | 54 | 0.0 |

| SIGNAL INPUT | | | EXPANDED SIGNAL OUTPUT | | |
|---|---|---|---|---|---|
| Res. Nos. | Val. ea. ohms | Rel. level at outer end,dB | Res. Nos. | Val. ea. ohms | Rel. level at outer end,dB |
| 16 & 17 | 100 | −21.0 | 25 & 26 | 50 | −24.0 |
| 15 & 18 | 100 | −6.0 | 24 & 27 | 50 | −12.0 |
| 14 & 19 | 100 | −2.5 | 23 & 28 | 185 | −5.0 |
| 13 & 20 | 100 | 0.0 | 22 & 29 | 115 | 0.0 |

Other compression and expansion ratios are readily obtained, and the number of resistors in each potentiometer in practice is much greater. A compandor made up of a compressor and expandor according to this invention tracks accurately, even with high compression ratios, if the path between the compressor and expandor has the correct loss.

Figure 2:
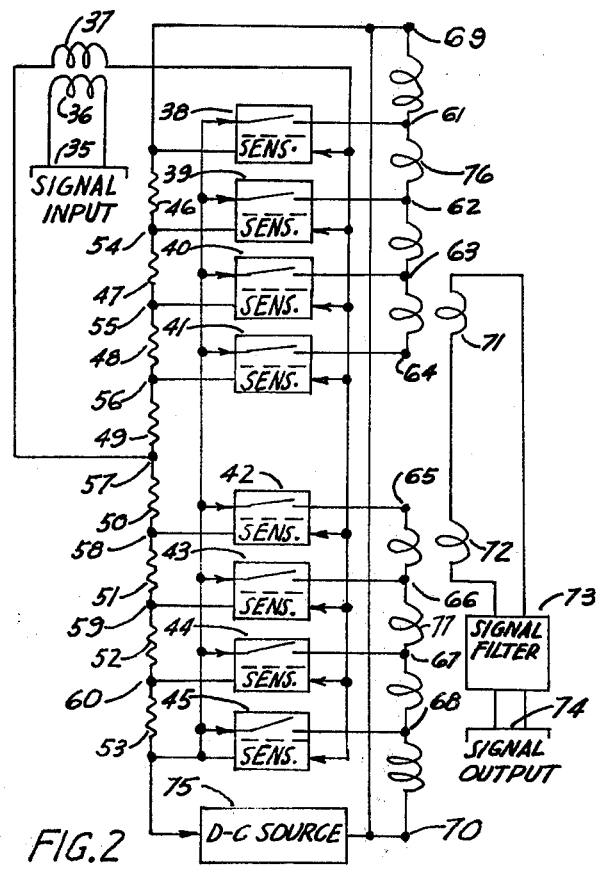
FIG. 2 shows a simplified schematic diagram of a quantizing modulator according to the invention which functions as a high-efficiency signal amplifier with or without signal compression and signal expansion.

FIG. 2 shows a simplified schematic diagram of a system according to the invention for high-efficiency amplification of a signal by quantized modulation of a d-c voltage. A signal input 35 passes through windings 36 and 37 of an isolation transformer. An input potentiometer made up of equal-value resistors 46 to 53 inclusive with junctions numbered 54 to 60 inclusive, respectively, is connected across constant-voltage d-c source 75. Only 8 resistors are shown for simplicity, although in practice 128 or more quantizing steps are commonly used. Input transformer winding 37 is connected from junction 57 at the midpoint of the potentiometer to the first sensing terminals of sensors 38 to 45 inclusive. Second sensing terminals of these sensors are connected to the upper terminal of resistor 46, terminals 54, 55, 56, 58, 59, 60 and the lower terminal of resistor 53, respectively. First switching terminals of all sensors are connected to a first terminal of d-c source 75.

Second switching terminals of the sensors are connected to terminals on primary windings of the output transformer, as follows:

| Sensor | Connected to Terminal | Sensor | Connected to Terminal |
|---|---|---|---|
| 38 | 61 | 42 | 65 |
| 39 | 62 | 43 | 66 |
| 40 | 63 | 44 | 67 |
| 41 | 64 | 45 | 68 |

Terminal 69 of primary winding 76 and terminal 70 of primary winding 77 are connected to a second terminal of d-c source 75. Primary windings 76 and 77 have tappings at identical numbers of turns, measured from terminal 64 to 69 and from terminal 65 to 70. Winding directions from terminals 64 to 69 and 65 to 70 are reversed. Secondary windings 71 and 72 are connected series aiding, to output filter 73, which has a pass-band equal to the signal band, and which delivers power to signal output circuit 74.

FIG. 2 functions as follows. We may assume with generality that the input signal across winding 37 is a sine wave with the maximum value intended for this circuit. At the zero crossing of the signal wave from winding 37 all sensors have voltage across their sensing terminals and hence none of the switches is closed. As the input wave increases from zero to a peak value of one polarity each of sensors 41, 40, 39 and 38 succesively has a zero voltage between its sensing terminals and closes and reopens its switch. As each switch closes and reopens it causes a pulse of current from d-c source 75 to flow through a section of primary winding 76, a different section for each switch, and a regularly decreasing section as the peak input wave is approached. Thus voltage pulses are induced in windings 71 and 72.

In a similar manner during the other half-cycle of the input signal, as the input signal increases from zero to the peak value of the opposite polarity each of sensors 42, 43, 44 and 45 successively has zero voltage between its sensing terminals and closes and reopens its switch. The choice of tappings on windings 76 and 77 are made so that the induced voltage at the output of filter 73 is a sine wave. The choice may be made so that if the input wave is reduced by a given amount, say 6 dB, the output wave is reduced 6 dB, in which case the amplifier gives neither signal compression or expansion. The output may be reduced 3 dB, in which case the amplifier gives signal compression, or may be reduced 12 dB, in which case the amplifier gives signal expansion.

Figure 3:
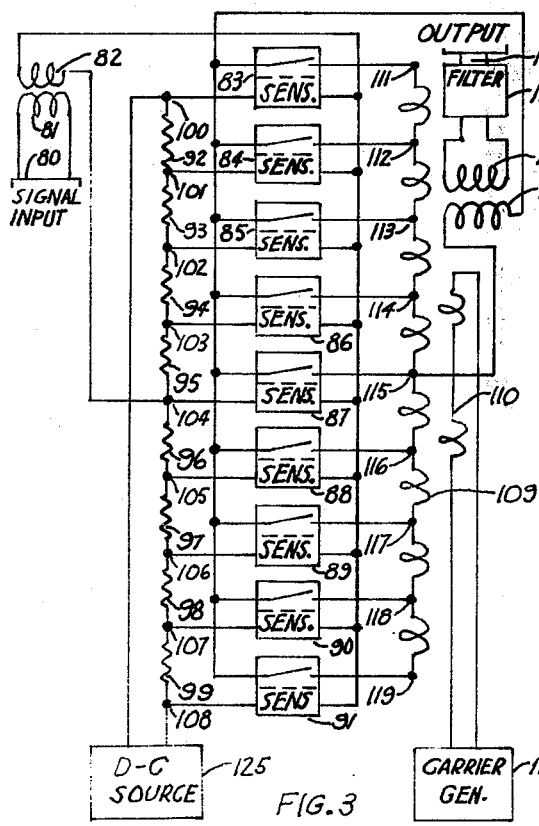
FIG. 3 shows a simplified schematic diagram of a quantizing modulator according to the invention which functions as a double-sideband carrier-suppressed amplitude modulator.

FIG. 3 shows a quantized modulation system which produces a double-sideband amplitude-modulated carrier. A signal input 80 is delivered through a transformer with windings 81 and 82, which isolates the signal source from constant-voltage d-c source 125 and constant-frequency constant-amplitude carrier generator 120. One lead from winding 82 is connected to first sensing terminals on sensors 83 to 91 inclusive, which have their second switching terminals connected to terminals 111 to 119 inclusive respectively, on winding 109 of the output transformer, and their second sensing terminals connected to terminals 100 to 108 inclusive, respectively, on an input potentiometer consisting of equal-value series-connected resistors 92 to 99 inclusive. A constant-voltage dc is applied across the potentiometer at terminals 100 and 108 from d-c source 125. Carrier generator 120 is connected across winding 110 of the output transformer. The center tap 115 on winding 109 is connected to one side of winding 121, and the first switching terminals of sensors 83 to 91 inclusive are connected to the other side of winding 121, on the isolation transformer with secondary winding 122, which delivers output to output filter 123, which has a pass-band equal to the band of the signal-modulated carrier, and then to signal-modulated carrier output 124.

The circuit of FIG. 3 functions as follows. When winding 82 delivers a sine-wave signal of the maximum amplitude, each sensor closes and reopens its switch in succession, thus connecting winding 121 in turn between each terminal on winding 109 and the center point 115 of winding 109. Winding 109 is coupled to carrier generator 120 by winding 110, hence winding 121 receives a series of carrier levels which have been quantized from the sine-wave signal by resistors 92 to 99 inclusive. The taps on winding 109 separate the winding into impedance sections which follow the same ratios as the resistors of the input potentiometer. Thus winding 122 delivers a double-side-band amplitude-modulated carrier, with a stepped envelope with the approximate waveform of the input wave, and output filter 123 smooths these steps and delivers a modulated carrier with an envelope which is the quantized equivalent of the input signal, to output circuit 124. As described, the output has full carrier level. Carrier level may be reduced by introducing loss in series with the switching circuit of sensor 87, and the carrier may be suppressed by disconnecting sensor 87.

Figure 4:
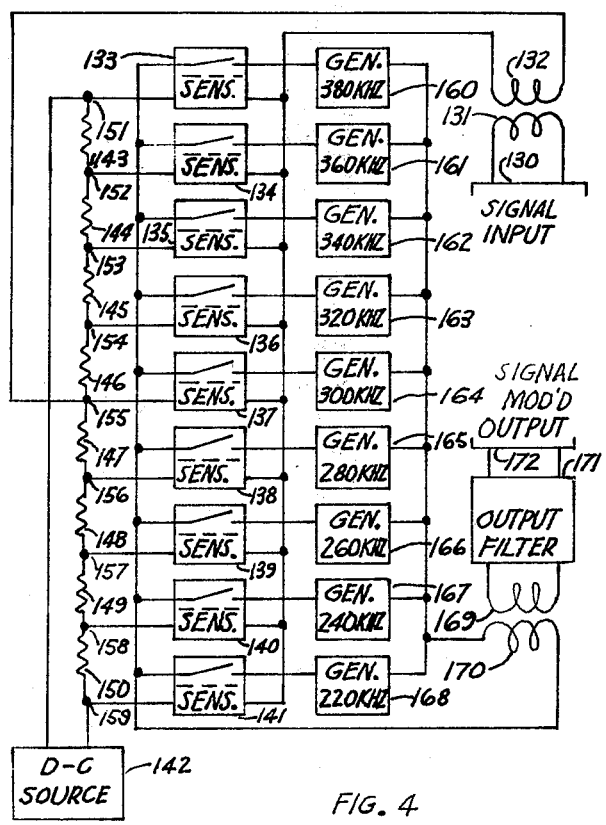
FIG. 4 shows a simplified block schematic diagram of a quantized modulator according to the invention which functions as an angle modulator.

FIG. 4 shows a simplified schematic diagram of a quantizing modulator according to the invention, which functions as an angle modulator. A signal input 130 is delivered through an isolation transformer with windings 131 and 132. One lead from winding 132 is connected to first sensing terminals on sensors 133 to 141 inclusive, which have their second switching terminals connected to the first terminals of wave generators 160 to 168 inclusive, respectively, their first switching terminals connected to a first terminal of output transformer winding 170, the second terminal of which is connected to the second terminals of wave generators 160 to 168 inclusive, and their second sensing terminals connected to terminals 151 to 159 inclusive, respectively, on a potentiometer made up of equal-value series-connected resistors 143 to 150 inclusive. A constant-voltage dc from d-c source 142 is applied across the potentiometer at terminals 151 and 159.

Each of wave generators 160 to 168 inclusive generates a constant-frequency constant-amplitude sine wave, these waves being spaced at equal or tapered frequency intervals across the range of frequency modulation desired, which is a maximum of about ±75 kHz in an f-m brodcast station. Thus for any amplitude of the signal at winding 130, one and only one sensor switching means is activated, applying a corresponding frequency from one of the wave generators to isolation transformer winding 170. When the signal at winding 132 moves from the maximum of one polarity peak to the maximum peak of opposed polarity, the frequency applied to winding 170 moves in a series of steps of 20 kHz each from 220 to 380 kHz. Transformer winding 169 delivers this wave to output filter 171, which has a bandwidth restricted to the band of the frequency-modulated wave, in this case about 200 to 400 kHz, and smooths out the abrupt frequency shifts as the wave generators are successively switched in and out of circuit. The wave generators normally derive their frequencies, equivalent in this case to harmonics of 20 kHz, from a single source.

The sensors used in FIGS. 1, 2, 3, 4, 5 and 6 may take a number of forms well-known in the prior art. A simple logic circuit with two inputs is well known which generates an output voltage only when the two input voltages differ by less than a given amount, and which provides the zero-sensing feature with high impedance which is required. The output voltage from the zero-sensing feature, if isolation from the switching means is not required in a particular application, may close a solid-state switch. If isolation is required the output voltage from the zero-sensing means may operate a light-emitting diode or similar device, which activates a photo-voltaic, photo-conductive or similar device, which is in itself a suitable switch or which actuates suitable switching means. It is obvious that the range of zero sensing of adjacent sensors must not meet or overlap, with suitable precautions being taken to avoid a condition where two switching means are closed simultaneously.

FIG. 5 shows another embodiment of the invention, in a modulator which receives a signal with maximum and minimum peak-to-peak values lying between known limits. An input potentiometer quantizes the signal into a number of equal intervals, in this figure four positive and four negative, for simplicity of drawing and explanation, although in a signal such as a speech wave at least 100 intervals of each polarity are commonly used. Each quantized level on the potentiometer is connected to a coincidence-sensing switching second switching terminals of sensors 188 and 195 are connected to lead 205, those of sensors 189 to 194 inclusive are connected through resistors 196 to 201 inclusive, respectively, to lead 205. Lead 205 is connected to resistor 202 and filter 203. Resistor 202, say 200 ohms in value, is connected from the midpoint of the input potentiometer to the free side of output filter 203. It has a pass-band equal to the signal band and presents a high impedance between its input terminals, is connected across resistor 202 and delivers signal output at 204. For a desired output signal, resistors may be computed simply, and are as follows for several types of output signals.

| Type of Output Signal | Sensor switch closed | Voltage across resistor 202 | Relative level in dB | Resistors Number | Value ohms | Filter 203 used |
|---|---|---|---|---|---|---|
| Linearly | 188 | 2.00 | 0.0 | — | 0 | yes |
| quantized | 189 | 1.50 | −2.5 | 196 and 201 | 133 | Yes |
| analog wave | 190 | 1.00 | −6.0 | 197 and 200 | 400 | Yes |
|  | 191 | 0.50 | −12.0 | 198 and 199 | 1200 | Yes |
| Linearly quan- | 188 | 2.00 | 0.0 | — | 0 | No |
| tized aperiodic | 189 | 1.50 | −2.5 | 196 and 201 | 133 | No |
| pulse ampli- | 190 | 1.00 | −6.0 | 197 and 200 | 400 | No |
| tude modulated wave | 191 | 0.50 | −12.0 | 198 and 199 | 1200 | No |
| Logarithmica- | 188 | 2.00 | 0.0 | — | 0 | Yes |
| lly quantized | 189 | 1.26 | −4.0 | 196 and 201 | 235 | Yes |
| analog wave | 190 | 0.80 | −8.0 | 197 and 200 | 600 | Yes |
| without compression | 191 | 0.50 | −12.0 | 198 and 199 | 1200 | Yes |
| Logarithmica- | 188 | 2.00 | 0.0 | — | 0 | Yes |
| lly quantized | 189 | 1.59 | −2.0 | 196 and 201 | 103 | Yes |
| analog wave, | 190 | 1.26 | −4.0 | 197 and 200 | 285 | Yes |
| compression ratio 2 | 191 | 1.00 | −6.0 | 198 and 199 | 400 | Yes |
| Logarithmica- | 188 | 2.00 | 0.0 | — | 0 | Yes |
| lly quantized | 189 | 0.80 | −8.0 | 196 and 201 | 600 | Yes |
| analog wave, | 190 | 0.32 | −16.0 | 197 and 200 | 2100 | Yes |
| expansion ratio 2 | 191 | 0.13 | −24.0 | 198 and 199 | 2877 | Yes | means, which keeps the associated switch closed when the signal amplitude is less than one-half interval on each side of the d-c voltage at the connected potentiometer point. For example in FIG. 5 the signal input 175 is delivered through winding 176 and winding 177 of an isolation transformer with a maximum peak-to-peak value of say 8 volts, connected to the midpoint of a potentiometer, comprising eight equal resistors 179 to 186 inclusive, say 100 ohms each, in series, which is connected across constant-voltage d-c source 187, with a voltage of say 8 volts, without loss of generality. The other terminal of winding 177 is connected to the first sensing terminals of eight sensors 188 to 195 inclusive, with their second sensing terminals individually connected to terminals of resistors in the potentiometer, except the terminal at the midpoint. Each sensor is designed to close its switch for a range of less than ±0.5 volt across its sensing terminals. Thus for a signal value of more than ±0.5 volt, one and only one sensor switching means will close, and remain closed as long as the input voltage remains within less than ±0.5 volt of the d-c voltage at the point on the potentiometer to which the sensor is connected. The first switching terminals of sensors 188, 189, 190 and 191 are connected to the positive terminal of d-c source 87. The first switching terminals of sensors 192, 193, 194 and 195 are connected to the negative terminal of d-c source 187. The FIG. 6 shows a quantized modulation system somewhat different in configuration but with a similar manner of functioning as FIG. 5 and simplified when a linearly quantized signal output is desired. A signal input 210 is delivered to an isolation transformer with primary 211 and secondary 212, having a definite maximum peak-to-peak voltage. One terminal of secondary 212 is connected to the first sensing terminals of sensors 222 to 229 inclusive, the other terminal being connected to the midpoint of a potentiometer comprising resistors 213 to 220 inclusive, all of the same value. D-c source 221, having a voltage equal to the maximum peak-to-peak voltage of winding 212, is connected across the potentiometer. Each junction point except the midpoint on the potentiometer is connected to the first switching and the second sensing terminals of one of sensors 222 to 229 inclusive.

Sensors 222 to 229 inclusive have their second switching terminals connected through resistors 230 to 237 inclusive, respectively, to lead 238, which is connected to one side of resistor 239 and output 240, the other side being connected to the center point of the potentiometer.

FIG. 6 functions as follows. Resistor 239 has a much higher vlaue than resistors 213 to 220 inclusive, so that closing a sensor switch does not appreciably affect the voltage at the sensor connection to the potentiometer. Under these conditions, if resistors 230 to 237 inclusive have a zero value, the signal output at 240 consists of a sequence of pulses of amplitude equal to the signal amplitude, with width determined by the range of coincidence sensing of the sensors, and spaced at irregular time intervals. These pulses fully define the input wave. This is a quantized aperiodic pulse amplitude modulated wave, abbreviated AQPAM.

If a logarithmically compressed signal output is desired, values of resistors 230 to 237 inclusive may readily be computed to provide this, with any specified ratio of compression. An expanded signal output can similarly be provided. If an analog output signal is desired, output resistor 239 may be replaced by a filter having an equal resistive input resistance, having a passband equal to the band of the input signal and able to follow the peaks of the pulse sequence delivered to the filter.

It is informative to look at the waveforms achievable by the embodiments of the invention of FIGS. 1, 5 and 6. We follow only FIG. 5 for simplicity. Without loss of generality the maximum peak-to-peak sine wave of the maximum frequency is applied as one input signal across winding 177 and the minimum peak-to-peak sine wave of the maximum frequency is applied as a second input signal. One cycle of these signals is shown in FIG. 7, divided linearly into 4 positive levels and 4 negative levels. In a speech wave there would normally be more than 100 each of positive and negative levels provided.

FIG. 8 shows the output across resistor 202 with filter 203 omitted in FIG. 5 when the sensors operate for only a narrow region on each side of zero voltage. This is the wave discussed under FIG. 6 as an AQPAM wave. It may be transmitted over any path suitable for a conventional PAM wave with equal pulse width, and can be integrated to produce the original signal waveform.

FIG. 9 shows the waveform generated by FIG. 5 with filter 203 omitted when the sensors have the maximum permissible sensing range of plus and minus one-half step on the input potentiometer. This wave can be integrated by a conventional filter to produce a wave with the signal input waveform substantially free from quantizing noise.

In all embodiments of the invention if the sensing range of the sensors is less than plus and minus one-half step on the input potentiometer the signal input may not contain zero frequency and a definite minimum frequency is required, depending on the pulse width, the size of each input step and the characteristics of the output filter. In practice, for example with speech waves, no difficulty arises.

With some signal inputs the maximum peak value of one polarity is always greater than the maximum peak value of the other polarity. In these cases in FIGS. 1 to 6 inclusive the side of the signal input circuit is not connected to the midpoint of input potentiometer as shown but to a point so that the peaks of the signal input just cover the d-c voltage extremes of the input potentiometer, and the connections to the signal output circuit are correspondingly altered.

In some cases the signal input has equal maximum positive and negative peak values, but different amounts of compression are required for each half-cycle of a wave of maximum amplitude. For example, where a signal wave is used to modulated an a-m broadcasting transmitter it is often desirable not to compress the peak positive modulation, but to compress the peak negative modulation by about 1 dB. This is effected in FIGS. 1, 2, 3, 5 and 6 by altering the values of the resistors of the output potentiometer or the impedance taps on the output transformer on one side of the zero level point in an appropriate manner.

We claim:

1. A quantizing modulation system for a signal which comprises:

a plurality of sensing means which compare said signal amplitude against the amplitudes of a plurality of equally spaced voltages extending across the amplitude range of said signal, said spacing being equal to or less than the smallest signal amplitude step to be reproduced, each of said sensing means sensing the instant at which the amplitude of said signal is substantially equal to a different one of said equally spaced voltages, and a plurality of switching means, each of which is associated with and is operated by one of said sensing means when said signal amplitude is substantially equal to one of said equally spaced voltages, and output means comprising a plurality of terminals on a network, each of which terminals is connected by one of said switching means to an output circuit, said network including one or more sources of power, and filter means connected to said output circuit, so that the output of said filter means is a function of said signal amplitude.

2. A quantizing modulation system according to claim 1 in which said plurality of terminals are connected to a network of resistors.

3. A quantizing modulation system according to claim 1 in which said plurality of terminals are connected to the primary windings of a transformer, and each of said plurality of switching means when operated connects a d-c power source to a different winding or group of windings on said transformer and the resultant current flowing in said winding or group of windings produces a voltage across an output winding on said transformer, which delivers an output to a smoothing filter which produces an output which is a function of said signal.

4. A quantizing modulation system in accordance with claim 1 in which said plurality of terminals are connected to a first winding on a transformer with a second winding connected to a source of carrier power, and each of said plurality of switching means when operated connects an output circuit between one of said terminals and a different terminal on said first winding, said output circuit including a smoothing filter for said carrier of varying amplitude, so that the envelope of said carrier at said output is a function of said signal.

5. A quantizing modulation system in accordance with claim 1 in which each of said plurality of terminals is connected to one of a plurality of alternating current carrier generators each of a different frequency and substantially the same amplitude, and each of said plurality of switching means connects a different one of said carrier generators to an output circuit, said output circuit including a smoothing filter, so that said output is a wave whose amplitude is substantially constant and whose frequency is a function of said signal.

* * * * *